United States Patent [19]

Heuberger et al.

[11] Patent Number: 5,461,348

[45] Date of Patent: Oct. 24, 1995

[54] PLL CIRCUIT MODULATABLE BY A MODULATION SIGNAL HAVING A DIRECT CURRENT COMPONENT

[75] Inventors: Albert Heuberger; Ludwig Wallrapp; Dieter Seitzer, all of Erlangen, Germany

[73] Assignee: Fraunhofer-Gesellschaft zur Fürderung der Angewandten Forschung e.V., Munich, Germany

[21] Appl. No.: 325,290

[22] PCT Filed: Mar. 11, 1993

[86] PCT No.: PCT/EP93/00559

§ 371 Date: Oct. 27, 1994

§ 102(e) Date: Oct. 27, 1994

[87] PCT Pub. No.: WO93/22829

PCT Pub. Date: Nov. 11, 1993

[30] Foreign Application Priority Data

Apr. 30, 1992 [DE] Germany ............... 42 14 385.3

[51] Int. Cl.⁶ .................................................. H03C 3/09
[52] U.S. Cl. .................. 332/128; 455/42; 455/76; 455/113; 455/119
[58] Field of Search ................................... 332/127, 128; 375/307, 376; 455/42, 75, 76, 113, 119

[56] References Cited

U.S. PATENT DOCUMENTS

| | | | |
|---|---|---|---|
| 3,622,913 | 11/1971 | Shipley | 332/16 |
| 4,447,792 | 5/1984 | Wynn | 332/128 |
| 4,682,124 | 7/1987 | Schutz | 332/127 |

FOREIGN PATENT DOCUMENTS

| | | |
|---|---|---|
| 0044155 | 1/1982 | European Pat. Off. . |
| 0215651 | 3/1987 | European Pat. Off. . |
| 3533222 | 3/1987 | Germany . |
| WO89/07865 | 8/1989 | WIPO . |

OTHER PUBLICATIONS

Delay lines give rf generator spectral purity, programmability; by Telewski et al., Electronics, Aug. 28, 1980, pp. 133–142.

*Primary Examiner*—Siegfried H. Grimm
*Attorney, Agent, or Firm*—Ralph H. Dougherty; Scott E. Hanf

[57] ABSTRACT

A PLL circuit modulatable by a modulation signal having a direct current component has a voltage-controlled main oscillator, a loop divider, a phase comparator and a loop filter. The reference frequency signal for the phase comparator is derived from the modulation signal by a first compensation filter, a voltage-controlled reference oscillator and a reference divider being connected downstream of said first compensation filter. The voltage-controlled main oscillator is controlled by the modulation signal via a second compensation filter followed by a downstream data lowpass.

5 Claims, 1 Drawing Sheet

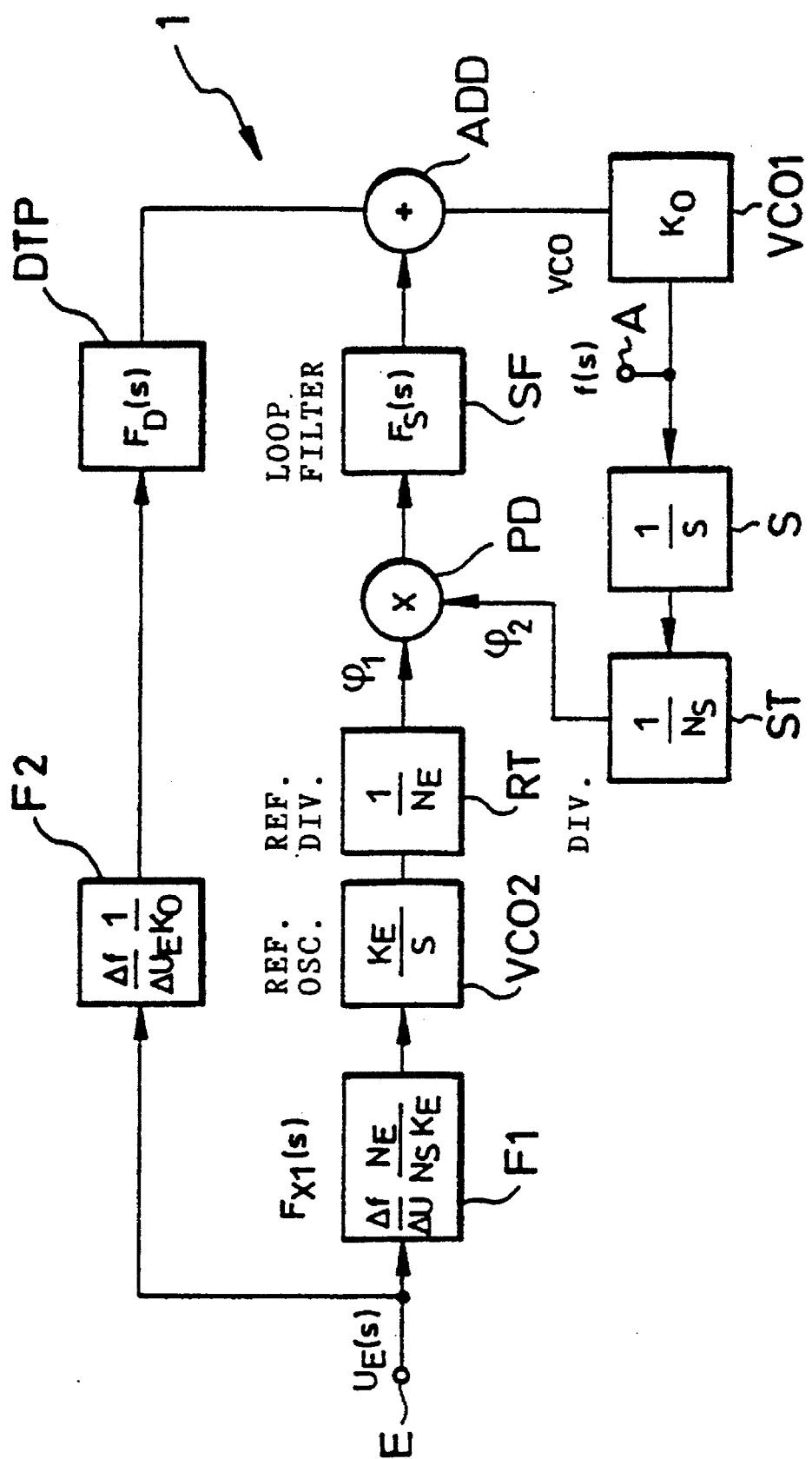

PLL CIRCUIT MODULATABLE BY A MODULATION SIGNAL HAVING A DIRECT CURRENT COMPONENT

FIELD OF THE INVENTION

The present invention refers to a PLL circuit modulatable by a modulation signal having a direct current component.

TECHNOLOGICAL BACKGROUND

A typical PLL circuit is arranged in such a way that the modulation is carried out against the PLL control loop. Such a PLL circuit typically includes a voltage-controlled oscillator having supplied thereto a composite signal on the input side, said composite signal comprising the modulation signal on the one hand and the output signal or error signal of a phase detector on the other.

The output of the voltage-controlled oscillator is simultaneously the output of the PLL circuit, which is coupled back to a phase comparator via a divider circuit, said phase comparator having supplied thereto a fixed reference signal. The phase difference is supplied to the loop filter. In this simple PLL circuit, the modulation signal acts as a disturbance which cannot be compensated for by the phase control loop. Hence, the lowest modulation frequency must necessarily be greater than the loop bandwidth of the loop filter. This standard PLL circuit is to be regarded as being advantageous insofar as it permits a simple channel adjustment, since the output frequency of the PLL circuit corresponds to the product of the divider ratio of the divider and the reference frequency. The same reference quartz can be used for all output frequencies. The circuit permits a linear frequency modulation shift. Such a circuit permits increments of 10 kHz when a suitable reference suppression is effected. As has already been stated, such a PLL circuit with modulation against the PLL control loop is only suitable for modulation frequencies which are greater than the loop bandwidth. This necessitates the exclusive use of dc-free codes for digital modulation, since otherwise lower frequency components in the modulation signal would be eliminated by the PLL control loop.

It follows that, in the field of transmitter technology, the use of a PLL circuit with modulation against the PLL control loop necessitates the use of dc-free codes. Hence, it is necessary to recode an input-side NRZ data stream into dc-free, so-called line codes. In this connection, the problem arises that the asynchronous digital source has to be synchronized with the clock of the coding employed by the transmitter. Hence, preliminary information on the data format of the source is required, viz. especially on the nature of the idle state (idle periods with high or low level), the nature of the synchronization of the bit stream (start bit, stop bit, etc.), the data rate, the rise time of the signals, the lengths of the telegrams, etc. In view of the fact that transparent transmission is demanded, i.e. a transmission without any previous knowledge of the nature and the format of the signal to be transmitted, such restrictions cannot be accepted.

Additional disadvantages of such a circuit with modulation against the control loop are, due to the necessary low loop bandwidth, its sensitvity with regard to frequency modulation disturbances caused by the microphonic effect and antenna feedback. Furthermore, the phase noise is determined by the input quality of the VCO resonator so that the use of a high-quality resonator is necessary; the sensitivity of said resonator with regard to the microphonic effect must be low, and a high isolation attenuation is required from the oscillator to the output.

DE 3533222 A1 already discloses a PLL circuit according to the generic clause, which is suitable to be modulated by a modulation signal having a direct current component. The known PLL circuit comprises a voltage-controlled oscillator whose input side has supplied thereto, on the one hand, the modulation signal via a decoupling capacitor and, on the other hand, an error signal coming from a loop filter. The output-side signal of the oscillator is simultaneously the output signal of the circuit, which is supplied to a loop divider having a fixed loop-divider factor. The output signal of the loop divider is supplied to a phase comparator whose second input has supplied thereto a reference frequency signal and whose output is connected to the loop filter. The reference frequency signal is obtained from the modulation signal via a synthesizer circuit by supplying said modulation signal, after lowpass filtering, to an analog-digital converter which controls a frequency generator via a control bus. A crystal-stabilized frequency is combined with the frequency coming from the frequency generator via a mixer and subsequent divider so as to obtain the desired reference frequency.

Although this known circuit does not entail the initially explained restrictions of conventional PLL circuits with modulation against the PLL control loop, its field of use is, due to the necessary complex circuit components, such as the analog-digital converter and the frequency synthesizer, limited to cases where costs and realization expenditure do not matter.

Also WO 89/07865 discloses a PLL circuit according to the generic clause, which is suitable to be modulated by a modulation signal. The known PLL circuit comprises a voltage-controlled oscillator whose input side has supplied thereto, on the one hand, the modulation signal and, on the other hand, an error signal coming from a loop filter. The output-side signal of the oscillator is simultaneously the output signal of the circuit, which is supplied to a loop divider having a loop-divider factor. The output signal of the loop divider is supplied to a phase detector whose second input is connected to the output of a reference divider with a divider factor, said reference divider being preceded by an upstream reference oscillator and the modulation signal being supplied to said reference oscillator. The output of the phase detector is connected to the loop filter.

SUMMARY OF THE INVENTION

Taking as a basis the prior art assessed hereinbefore, it is therefore the object of the present invention to provide a PLL circuit of the type mentioned at the beginning, which can be realized with a simple circuit structure although it is adapted to be modulated by a modulation signal having a direct current component.

This object is achieved by a PLL circuit modulatable by a modulation signal having a direct current component, comprising a voltage-controlled main oscillator which is adapted to have supplied thereto on its input side a control signal derived from the modulation signal as well as an error signal and which supplies on its output side an angle-modulated output signal of the PLL circuit, a loop divider which is connected downstream of said main oscillator and which has a loop-divider factor, a phase comparator whose inputs are adapted to have supplied thereto the output of the loop divider and a reference frequency signal derived from the modulation signal, a loop filter which is connected downstream of the phase comparator and which supplies the error signal, a voltage-controlled reference oscillator, and a reference divider with a reference divider factor, which is connected downstream of the reference oscillator and which supplies the reference frequency signal for the phase comparator, a first compensation filter whose input side is adapted to have supplied thereto the modulation signal and whose output side is connected to the control input of the reference oscillator, the transfer function of said first compensation filter being proportional to the reference divider factor and inversely proportional to the loop-divider factor and the tuning slope of the reference oscillator, and a second compensation filter whose input side is adapted to have supplied thereto the modulation signal and whose output side supplies the control signal, the transfer function of said second compensation filter being inversely proportional to the tuning slope of said main oscillator.

BRIEF DESCRIPTION OF THE DRAWINGS

In the following, a preferred embodiment of the PLL circuit according to the present invention will be explained in detail with reference to the drawing enclosed, in which the only FIGURE shows a block diagram of the PLL circuit according to the present invention.

DESCRIPTION OF THE PREFERRED EMBODIMENT OF THE INVENTION

The PLL circuit according to the present invention, which is modulatable by a modulation signal having a direct current component, is designated generally by reference numeral 1 in the FIGURE. It comprises two voltage-controlled oscillators, viz. the voltage-controlled main oscillator VCO1, which can also be referred to as voltage-controlled HF oscillator, and the voltage-controlled reference oscillator VCO2, which can also be referred to as voltage-controlled LF oscillator. The output of the voltage-controlled main oscillator VCO1 is simultaneously the output A of circuit 1. The output signal of the voltage-controlled main oscillator VCO1 is supplied to an integrating circuit S. Said integrating circuit S represents an ideal integrator in the sense of a Laplace transform.

The output of the integrating circuit S is supplied to a loop divider ST having a loop-divider factor $N_S$. The resultant phase signal is supplied to one of the two inputs of a phase comparator PD (with the slope KP) whose other input has supplied thereto a reference frequency signal. The generation of said reference frequency signal will be explained hereinbelow.

The output of said phase comparator PD is supplied to the loop filter SF generating on its output side an error signal which is supplied to the input of an adder ADD whose output is connected to the control input of the main oscillator VCO1.

The modulation signal, which is applied to an input E of circuit 1, is supplied via a first compensation filter F1 to the voltage-controlled reference oscillator VCO2, which is, in turn, connected to a reference divider RT on the output side thereof. The reference divider RT has its output side connected to the reference frequency input of the phase comparator PD.

The modulation signal $U_E$ applied to input E is additionally supplied to the other input of the adder ADD via a second compensation filter F2 and via a data lowpass DTP, the first input of said adder ADD having supplied thereto the error signal coming from the loop filter SF.

The transfer function $F_{x1}(S)$ of the first compensation filter F1 is proportional to the frequency shift delta F of the reference oscillator VCO2, and, in addition, proportional to the reference divider factor $N_E$, and inversely proportional to the loop-divider factor $N_S$ and the tuning slope $K_E$ of the reference oscillator VCO2.

The transfer function $F_{x2}(S)$ of the second compensation filter F2 is, however, proportional to the frequency shift delta F of the main oscillator VCO1 and inversely proportional to the tuning slope $K_0$ of said main oscillator VCO1.

In the circuit according to the present invention, the reference oscillator, which can be a voltage-controlled quartz oscillator VCXO, is modulated by low frequency components of the modulation signal $U_E(S)$. The high frequency components of the modulation signal $U_E(S)$ are used for directly modulating the voltage-controlled main oscillator VCO1.

The values set in the compensation filters F1, F2, which concern the divider factors and the oscillator slopes, must correspond to the physical values of the oscillators. If this is not the case, the resultant frequency modulation shift will become frequency-dependent.

As has already been explained, the low-frequency components of the frequency shift are determined by the first compensation filter F1. The parameters of this filter can, if necessary, be realized as processor-controlled adjusted parameters. In a narrow-band version of the transmitter, a processor-controlled or rather software-controlled adjustability of the filter is not necessary, since the only variable parameter, viz. the loop-divider factor $N_S$, varies in accordance with the bandwidth ratio during operation.

In a broad-band version of the transmitter, changes of the divider factor $N_S$ may occur so that a processor-controlled adjustability of the parameter can become necessary in this case. If this is the case, the processor-controlled adjustment of the frequency shift delta F to be selected will be carried out simultaneously in the first compensation filter F1 in the lower frequency range.

As has already been explained, the high-frequency components of the frequency shift are determined by the second compensation filter F2 alone, and, consequently, they only depend on the tuning slope $K_0$ of said main oscillator VCO1. In view of the fact that this value can be strongly non-linear, the possibility of adjusting this parameter $K_O$ of the second compensation filter F2 under processor control offers itself. A processor-controlled adjustability of the frequency shift delta F for the upper frequency range is possible as well.

In the frequency range, sideband frequencies of the carrier frequency are generated at a distance n. reference frequency by the phase comparator PD. These undesired spectral components, which, depending on the post office regulations in question, must not exceed a specific power (e.g. −37 dBM) in the adjacent channel, increase in proportion to the distance between the phases of the reference oscillator VCO2 and the main oscillator VCO1.

When an ideal modulation is carried out with and against the phase by means of the PLL circuit according to the present invention, a phase difference which would necessitate compensation will not occur at the phase comparator PD so that the spectrum will not include any reference lines caused by the modulation. This has the advantage that a higher loop bandwidth of the loop filter SF can be chosen before the admissible power in the adjacent channel is exceeded. This has the advantage that the influences originating from the microphonic effect and from antenna feedback are reduced.

We claim:

1. A PLL circuit modulatable by a modulation signal having a direct current component, comprising a voltage-controlled main oscillator which is adapted to have supplied thereto on its input side a control signal derived from the modulation signal as well as an error signal and which supplies on its output side an angle-modulated output signal of the PLL circuit, a loop divider which is connected downstream of said main oscillator and which has a loop-divider factor, a phase comparator whose inputs are adapted to have supplied thereto the output of the loop divider and a reference frequency signal derived from the modulation signal, a loop filter which is connected downstream of the phase comparator and which supplies the error signal, a voltage-controlled reference oscillator, and a reference divider with a reference divider factor, which is connected downstream of the reference oscillator and which supplies the reference frequency signal for the phase comparator, a first compensation filter whose input side is adapted to have supplied thereto the modulation signal and whose output side is connected to the control input of the reference oscillator, the transfer function of said first compensation filter being proportional to the reference divider factor and inversely proportional to the loop-divider factor and the tuning slope of the reference oscillator, and a second compensation filter whose input side is adapted to have supplied thereto the modulation signal and whose output side supplies the control signal, the transfer function of said second compensation filter being inversely proportional to the tuning slope of said main oscillator.

2. A PLL circuit according to claim 1, comprising a data lowpass connected downstream of said second compensation filter.

3. A PLL circuit according to claim 1, comprising an adder whose input side is adapted to have supplied thereto the control signal and the error signal and whose output side is connected to the control input of the main oscillator.

4. A PLL circuit according to claim 1, wherein the transfer function of the first compensation filter is, in addition, proportional to the frequency shift of the reference oscillator.

5. A PLL circuit according to claim 1, wherein the transfer function of the second compensation filter is, in addition, proportional to the frequency shift of the main oscillator.

* * * * *